(12) United States Patent
Salam (10) Patent No.: US 6,346,771 B1
(45) Date of Patent: Feb. 12, 2002

(54) HIGH POWER LED LAMP

(75) Inventor: Hassan Paddy Abdel Salam, London (GB)

(73) Assignee: Unisplay S.A., Geneva (CH)

( * ) Notice: Subject to any disclaimer, the term of this patent is extended or adjusted under 35 U.S.C. 154(b) by 0 days.

(21) Appl. No.: 09/196,358

(22) Filed: Nov. 19, 1998

(30) Foreign Application Priority Data

Nov. 19, 1997 (GB) ............................................. 9724507
Sep. 17, 1998 (GB) ............................................. 9820311

(51) Int. Cl.$^7$ ................................................. H01N 1/02
(52) U.S. Cl. ...................... 313/499; 313/498; 313/512; 313/504
(58) Field of Search ................................. 313/512, 498, 313/506, 504, 503, 499

(56) References Cited

U.S. PATENT DOCUMENTS

| 4,163,953 A | | 8/1979 | Springthorpe et al. . 331/94.5 H |
| 4,881,237 A | * | 11/1989 | Donnelly ..................... 372/50 |
| 5,734,225 A | * | 3/1998 | Biebuyck et al. ........... 313/512 |
| 5,905,275 A | * | 5/1999 | Nunoue et al. ............... 257/95 |
| 6,045,240 A | * | 4/2000 | Hochstein ................... 362/294 |
| 6,019,195 A | * | 7/2000 | Forrest et al. .............. 313/504 |

FOREIGN PATENT DOCUMENTS

| GB | 2296378 | 6/1996 |
| GB | 2304230 | 3/1997 |

* cited by examiner

*Primary Examiner*—Ashok Patel
*Assistant Examiner*—Ken A Berck
(74) *Attorney, Agent, or Firm*—Dykema Gossett PLLC (57) ABSTRACT

A high-power LED lamp uses an LED chip that can be larger than 1mm square. The chip has trenches that can convert light trapped in the semiconductor into light that passes through a major surface of the chip. The trenches include light-reflecting tracks joined to a chip terminal and feeding a semiconductor layer. The chip can have triangular light emitting elements that improve light extraction from the semiconductor. The elements can be fused, resulting in improved manufacture yield of chips. A 25 watt single chip lamp with a heat sink very close to the active region is described.

42 Claims, 5 Drawing Sheets

HIGH POWER LED LAMP

FIELD AND BACKGROUND OF THE INVENTION

The present invention is related to single-chip LED lamps. The purpose of the present invention is to provide a single-chip LED lamp that is up to 250 times more more powerful than a conventional single-chip LED lamp.

Existing single-chip LED lamps are generally of low input power, typically 40–150 milliwatts. There has been a need for a long time for a single-chip LED lamp of higher power, for example 1 watt or more. The need for a higher power single-chip LED lamp has not been met in spite of the fact that an enormous amount of effort has gone into improvement of LED devices. The amount of effort that has gone into improvement of LED devices is evidenced by the fact that international class H01L 33/00, which is devoted to improvement of LED devices, has thousands of patent publications all differing in disclosure.

Designers of lamps for outdoor use have had the choice mainly of incandescent tungsten light sources, gas discharge light sources, and LED light sources. Designers of LED-based lamps requiring high power have had to resort to using clusters of single chip LED lamps, each of about 0.1 watt rating, wired in series or in parallel and housed together as a single lamp unit to achieve enhanced power. Providing a lamp unit by clustering single-chip LED lamps is very costly, since it involves making several single-chip lamps, housing them in a unit, wiring them up, and testing the final unit. U.S. Pat. No. 5,382,811 and 5,632,551 provide examples of cluster lamps.

Applications for high power LED lamps include outdoor displays, which usually have to operate in direct sunlight and so require powerful lamps, and vehicle lights and traffic lights. At present long-life LED traffic lights for use at street intersections need more than a hundred conventional single-chip LED lamps for each lamp unit. The need to use many LED lamps to provide a single LED traffic light is a disadvantage, particularly since only one tungsten light source is needed for a conventional traffic light.

Prior art single-chip LED lamps having clear convergent lenses, used widely in outdoor displays, suffer not only from the fact that they are of low power but also from the fact that they project light that is not uniform. The-non-uniformity is partly due to the bonding pad or pads on the chip top face, which are projected by the lamp as dark areas. The typical width of the bonding pad is about 30–40% of the width of the chip and this is large enough to interfere with achieving good uniformity of projected light even if the LED lens is defocussed relative to top face of the chip. For good quality image displays it is desirable to match the apparent brightnesses of the lamps to within 5%. To achieve this it is important to reduce the non-uniformity caused by the bonding pads.

SUMMARY OF THE INVENTION

An object of the present invention is to provide a single chip LED lamp that avoids or reduces the need for clustering.

A further object of the present invention is to provide a single chip LED lamp arranged so that light emitting portions of the chip are adjusted to be equalised in intensity.

A further object of the present invention is to provide a single chip LED lamp in which the sizes of the bonding pads relative to the size of the chip are reduced, so as to improve uniformity of light projected by a lensed lamp.

A further object of the present invention is to provide a single chip LED lamp, with input power in the region of 5–25 watts, that has low rise of the junction temperature when energised, thus prolonging the life of the lamp and reducing or eliminating the need for forced ventilation of the lamp.

A further object of the present invention is to provide a single chip LED lamp arranged so that light emitting portions of the chip that are faulty by short-circuit are automatically starved of electrical power.

According to an aspect of the invention an LED light source suitable for an LED lamp includes an LED chip having a top face and comprising a substrate and semiconductor layers between the top face and the substrate, the semiconductor layers forming the core of a light guide extending parallel to the plane of the top face. The chip includes at least one cavity with light-emitting side walls that extends into at least one of the semiconductor layers. The chip converts guided light in the core into top light. According to another aspect of the invention guided light in the core is extracted with the aid of reflectors that are parallel to the semiconductor layers. According to yet another aspect of the invention metal tracks connected to the n-type semiconductor layer are provided that enhance the efficiency of the lamp.

According to another aspect of the invention an LED light source includes a chip comprising at least two light emitters each having a triangular top face, the two emitters being separated by a trench.

According to another aspect of the invention a single chip LED lamp which can have input power of 5–25 watts includes an LED chip having a top face and comprising a substrate and semiconductor layers between the top face and the substrate, the semiconductor layers forming the core of a light guide extending parallel to the plane of the top face. The chip includes at least one trench, and a heat sink is attached to the top face of the chip that draws heat from the active region of the chip.

According to another aspect of the invention an LED light source has an LED chip with a plurality of individually powered light emitting elements each provided with a fuse. This improves the yield of usable LED chips during manufacture.

DESCRIPTION OF PREFERRED EMBODIMENTS

In the present invention, "top light" means light that leaves an LED chip by passing through the top face of the chip. The "top face" of the chip means the face of the chip that is furthest away from the substrate of the chip. Cavity tops, side walls and floors are not considered to be part of the top face. "Lens" means a convergent lens. "Guided light" means light propagated by repeated reflections inside a light guide. "High-power LED lamp" means an LED lamp using an LED chip in which the input power rating of the chip exceeds 150 milliwatts.

Figure 1:
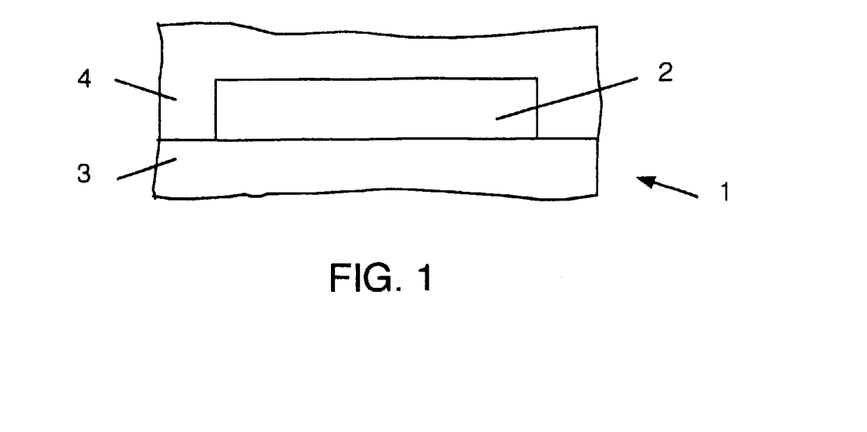
FIG. 1 illustrates in side view an LED light source according to an embodiment of the invention.
Figure 2:
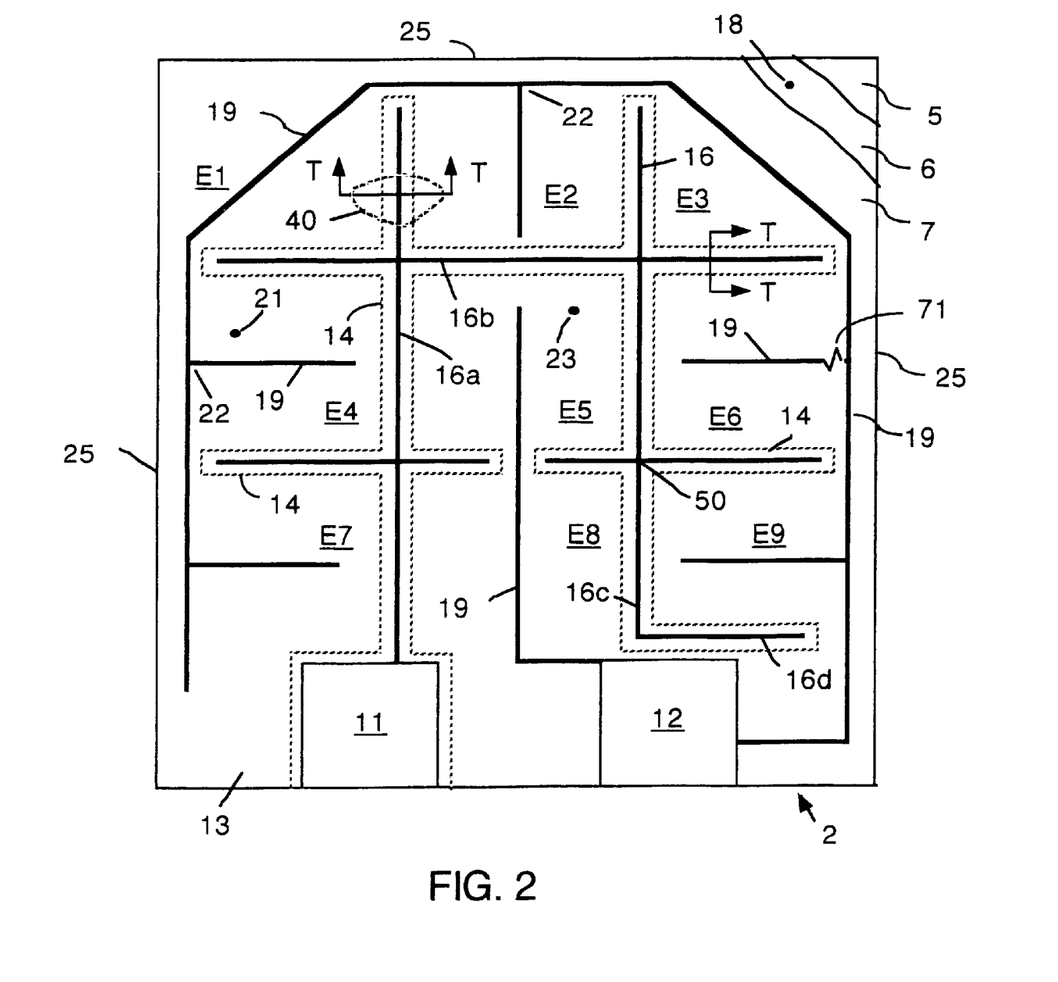
FIG. 2 is a plan view of the LED chip in FIG. 1.
Figure 3:
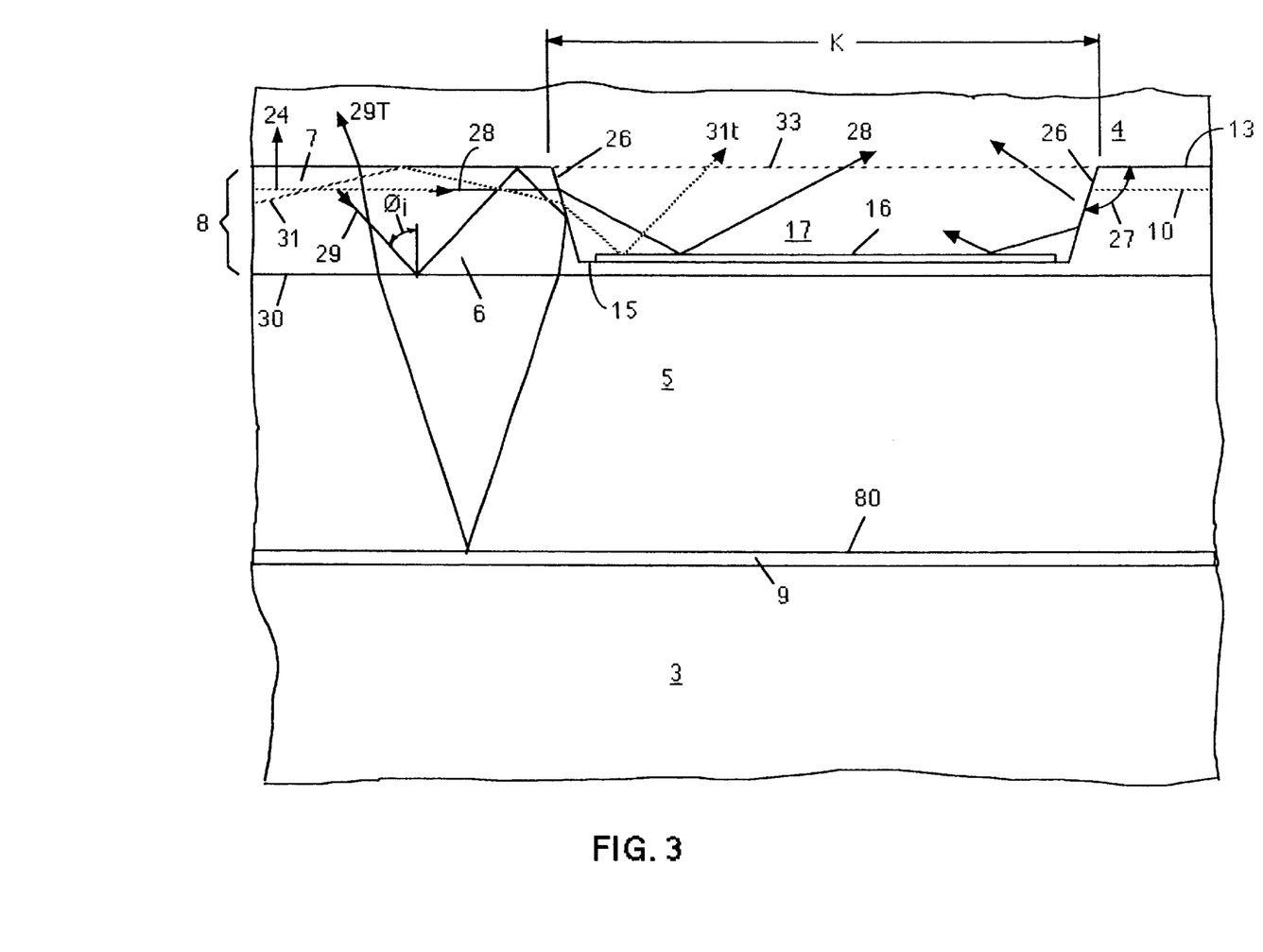
FIG. 3 is a sectional view of a portion of chip 2.

FIGS. 1–3 illustrate an improved LED light source according to an embodiment of the invention. Light source 1 comprises an LED chip 2 mounted on a metal support 3 which may be part of a reflective bowl the floor of which acts as a heat sink. Over chip 2 there is a cover 4 of transparent dielectric material. FIG. 3 is a sectional view taken along T—T of a portion 40 of chip 2.

Chip 2 comprises a transparent base 5 over which is formed a layer 6 of n-type semiconductor material. A layer 7 of p-type semiconductor material is formed over n-layer 6. Each of semiconductor layers 6, 7 can be less than 5 microns thick. Semiconductor layers 6, 7 are referred to collectively as semiconductor 8. Each of the basic n, p layers 6, 7 may include supplementary layers, not shown, that enhance the performance of the chip, or that simplify its manufacture. For example, p-layer 7 may include a thin light-passing gold layer on top of it to, in effect, enhance the electrical conductivity of the p-layer, and the n-layer may include a low resistively semiconductor layer for enhancing electrical connection within the n-region of chip 2. Active region 10 may include a thin layer of active region material that enhances light generation or that determines the color of the light generated. The whole of the plane of the top of chip 2 up to side faces 25 constitutes a first major surface of chip 2. The lower surface 80 of substrate 5 constitutes a second major surface of chip 2. A reflector 9 is placed on the lower surface 80 of substrate 5. Reflector 9 can be a mirror coating of silver or aluminum.

Transparent cover material 4 has a refractive index nc that is greater than 1.25, and preferably greater than 1.4. Furthermore, $n_c$ is less than the refractive index $n_s$ of semiconductor 8. The value of $n_c$ is preferably such that $n_s$ is more than 20% higher, and more preferably more than 30%, higher than the value of $n_c$.

Transparent substrate 5 is chosen to be of a material having a refractive index nb that is at least 15%, and preferably at least 20%, less than the refractive index $n_s$ of semiconductor 8. The arrangement is such that semiconductor 8 together with media 5, 4, acts as a planar light guide, with the light being guided in semiconductor core 8.

Electrically connected to n-layer 6, by contact of its lower surface with n-layer 6, is a bonding pad terminal 11. Electrically connected to p-layer 7, by contact of its lower surface with p-layer 7, is a bonding pad terminal 12. Formed into top face 13 of chip 2, for example by etching, are elongate cavities or trenches 14. The cross-section T—T of trench 14 is illustrated in FIG. 3. Trench 14 has a floor portion 15 that is in the n-layer and that is parallel to chip top face 13. Joined to floor 15, and thereby electrically connected to the buried n-layer 6, is a metallic conductor track 16, comprising gold or other low resistivety metal. For chips generating green or blue light the track 16 preferably comprises metal of good reflectivity to green and blue light, such as aluminum.

Trench 14 is filled with transparent dielectric material 17 having a refractive index nt that is less than 80% of the refractive index of semiconductor 8. Material 17 is preferably of plastic, such as epoxy. Material 17 may be the same as translucent material 4, or it may be different. All conductors 16 are metallically connected to each other and to bonding pad terminal 11. Thus current from a point 18 in the buried n-layer can reach n-terminal 11 via conductors 16 that are near point 18, instead of only by passing through the whole length of the n-layer between point 18 and terminal 11.

By means of conductors 16, the voltage drop between bonding pad 11 and any point on the n-layer, such as 18, is reduced. This increases the lumens-per-watt efficiency of the chip. Furthermore, the distribution of current and hence the generated light throughout the chip top is made more even.

Conductors 16 comprise meandering tracks. Thus, for example, conductors 16a, 16b together constitute a meandering track, i.e. a track that changes its direction. Conductors 16c, 16d constitute another meandering track. Conductor tracks 16 have node points 50 that join a plurality of tracks together. The width of conductor 16 can be 5–20 $\mu$m and its thickness can be 0.5 $\mu$m or more. Conductors 16 can be formed by the same process steps as are used for making pad 11, or by similar process steps.

Joined to the top of p-layer 7, and thereby electrically connected to p-layer 7, are electrical conductor tracks 19 shown only in FIG. 2, which may comprise gold or other metal. All conductors 19 are metallically connected to each other and to bonding pad terminal 12. Thus current applied to bonding pad 12 can reach a point 21 in p-layer 7 that is remote from bonding pad 12, mainly via conductors 19, instead of via the p-layer only. Conductor tracks 19 have node points 22 that join a plurality of tracks together. Conductors 19 can be formed by the same process steps as are used for making pad 12, or by similar process steps. The network of conductors 19 comprises meandering tracks.

By means of conductors 19, the voltage drop between bonding pad 12 and any point on the p-layer, such as 21, is reduced This increases the lumens-per-watt efficiency of the chip. Furthermore, the distribution of current and hence the generated light throughout the chip top is made more even.

Conductors 19 may be 1–50 $\mu$m wide, or more, and 0.2 to 2 $\mu$m thick. Because of their narrow width, dark lines produced by conductors 19 disappear when an image of light source 2 is projected by a defocussed lens. If the p-layer is such that it has a thin light-passing gold layer all over it, then, by incorporating conductors 19 to feed the p-layer, the thickness of the gold layer can be reduced, allowing more light to pass through the gold layer and, therefore, increasing the top light of the chip, while still maintaining low resistance connection to the p-layer.

A ray of light generated within the chip at a point 23 can have any one of many directions. If the direction of the ray is normal or nearly normal to top face 13 of the chip it passes out of the chip as top light 24. If the ray is parallel or nearly parallel to top face 13 of the chip it travels in semiconductor 8, which acts as a light guide core, until it meets a side exit face. In the arrangement of FIGS. 1–3, there are four outer side faces 25 of chip 2 and several supplementary side faces 26 provided by trenches 14. Supplementary side faces 26 allow light progressing sideways in semiconductor layers 6, 7 to escape from the chip without having to travel all the way to outer side faces 25. Because the sideways light trapped between media 4, 5 travels a shorter distance within semiconductor 8 before it escapes, it is attenuated less. This lower light attenuation facilitates making large, bright LED chips. Conductors 16, 19 result in lower electrical losses and so, also, facilitate making large, bright LED chips.

Light emanating from chip 2 is illustrated by various rays shown in FIG. 3. Each trench wall 26 forms an obtuse angle 27 with the part of top face 13 that adjoins the side wall and emits light. Obtuse angle 27 is preferably between 95 and 130 degrees, and more preferably between 110 and 120 degrees. Wall 26 may have a curved cross section. In this case angle 27 is measured between the plane tangential to the wall half way up the height of the wall and top face 13.

The depth of trench 14 is preferably more than 50% of the thickness of semiconductor B, so as to allow a large proportion of the light in semiconductor 8 approaching the trench to escape through trench wall 26. The thickness of the layer of n-type material under metal track 16 is preferably greater than 5% of the total thickness of the n-layer, so as to maintain good electrical connection between track 16 and the body of n-type semiconductor material either side of trench 14.

The paths of rays 28, 29 generated at the semiconductor active region 10 are illustrated in FIG. 3. Because the index of refraction $n_s$ of semiconductor 8 is higher than the index of refraction $n_t$ of cover material 4 and trench wall 26 forms an obtuse angle with chip top face 13, horizontal ray 28 hitting trench wall 26 is diverted downwards by refraction as it passes through wall 26. Ray 28 is then reflected upwards by reflector 16 to pass through aperture 33 of the trench. It is not only horizontal rays that will pass through trench wall 26. Rays that have been guided by multiple internal reflection in semiconductor 8 that hit wall 26 with a small angle of incidence will also pass through the wall, such as ray 31.

Ray 29 hitting interface 30 between semiconductor 6 and base 5 at an an angle of incidence $\varnothing_i$ of 45 degrees is totally reflected at interface 30, as shown, and then again at interface 13. Ray 29 is propagated sideways by the previously mentioned light-guide property of layers 4, 8, 5. Total reflection of ray 29 at interface 30 occurs because the angle of incidence $\varnothing_i$ is greater than the critical angle $\varnothing_{csb}$ for total internal reflection at interface 30. The reflected ray 29 hits top surface 13 at 45 degrees, and it is again totally reflected, because the angle of incidence of ray 29 to top surface 13 is greater than the critical angle $\varnothing_{csc}$ for the interface between semiconductor 8 and cover material 4. Ray 29 then hits trench wall 26. At trench wall 26 ray 29 is yet again totally reflected. Total reflection of ray 29 occurs at surface 26 because its angle of incidence is greater than the critical angle $\varnothing_{cst}$ for the interface between semiconductor 8 and trench material 17. After being diverted by reflection by trench wall 26, ray 29 exits semiconductor 8 through interface 30. Ray 29 exits semiconductor 8 because it hits interface 30 at an angle of incidence that is less than the critical angle $\varnothing_{csb}$ for interface 30. Ray 29 is then reflected by reflector 9 upwards to exit through chip top face 13 as top light ray 29T.

Taking the case, for example, where:

Cover medium 4 and trench material 17 are both of epoxy having a refractive index of 1.5, i.e. $n_c = n_t = 1.5$;

Base 5 is sapphire having a refractive index of about 1.7, i.e. nb=1.7;

Semiconductor 8 has a refractive index $n_s=3$ Obtuse angle 27 has a value $\varnothing_{27}=100°$ Then:

$\varnothing_{csc} = \sin^{-1} n_c/n_s = \sin^{-1} 0.5 = 30°$ $\varnothing_{cst} = \sin^{-1} n_t/n_s = \sin^{-1} 0.5 = 30°$ $\varnothing_{csb} = \sin^{-1} n_b/n_s = \sin^{-1} 1.7/3 = \sin^{-1} 0.567 = 34.5°$.

After it is diverted by face 26, the angle of incidence of ray 29 to interface 30 is equal to: $45° - 2(\varnothing_{27} - 90°) = 25°$, which is less than $\varnothing_{csb}$. If $\varnothing_{27}$ is increased to 110° the angle of incidence of ray 29 to interface 30 reduces to 5°.

If the layers of semiconductor 8 have unequal refractive indexes, the value of ns is taken to be equal to the highest of these unequal refractive indexes. Substrate 5 may comprise a transparent support covered with a thin layer, next to core 8, having the refractive index no. In this case the transparent support may be of material, such as semiconductor, having a higher refractive index higher than $n_b$. For the thin layer to provide good reflection to guided light the thickness of the thin layer should be greater than the wavelength of the light generated, and preferably greater than twice the wavelength of the light generated.

Until it hits side wall 26, ray 29 is guided light travelling in the core of a light guide. The guided light 29 becomes converted into top light 29T. Light 29T is light that has passed through the p-layer 7 and top face 13. The top surface of metal support 3 can be relied on for reflecting light at the bottom of substrate S if there is no reflective coating 9 on substrate 5.

The arrangement of FIG. 2 can be regarded as consisting of nine elemental areas E1–E9 each emitting top light, each having at least one corner next to two trenches 14, and each covered with at least one top conductor 19. There is a trench 14 running between each adjacent pair of areas E. Top light 24 from top face 13 of each adjacent pair of elements E is accompanied with trench light emanating from the trench between the pair. The chip can be large, for example up to 1000 μm or more wide, and it may have more than nine elements E. Pads 11, 12 can each be about 150 μm square or less. The width of each element E is arranged to be several times greater than width K of trench 14. For example, the width of element E5 may be 300 μm and K may be 15 μm. Trench width K is preferably several times greater than the wavelength of the light from the active region, and is preferably more than twice the depth of trench 14. Conductor 16 between a pair of elements E provides a low resistance connection between the pair.

Figure 4:
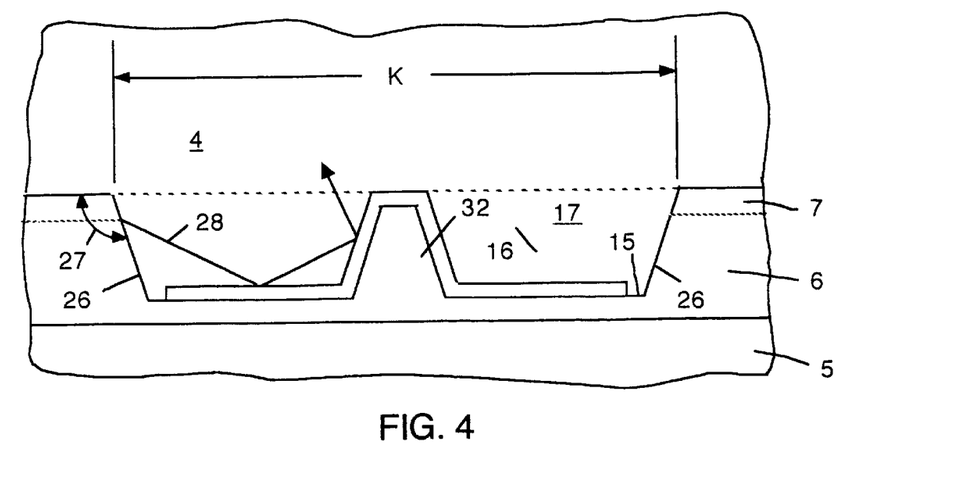
FIG. 4 is a cross-sectional view of a trench having a central ridge.

Transparent dielectric material 17 filling the trench may have a refractive index $n_t$ between 1.25 and 2.5. The value of $n_t$ affects transmission of light through wall 26, The higher the value of $n_t$ the larger the critical angle $\varnothing_{cst}$ at the inner face of trench wall 26 will be. With a larger critical angle more light can pass through trench wall 26. Trench 14 may have a central ridge 32, illustrated in FIG. 4, which extends along its length. Track 16 covers ridge 32. Ray 28 is shown doubly reflected by ridged track 16.

Figure 5:
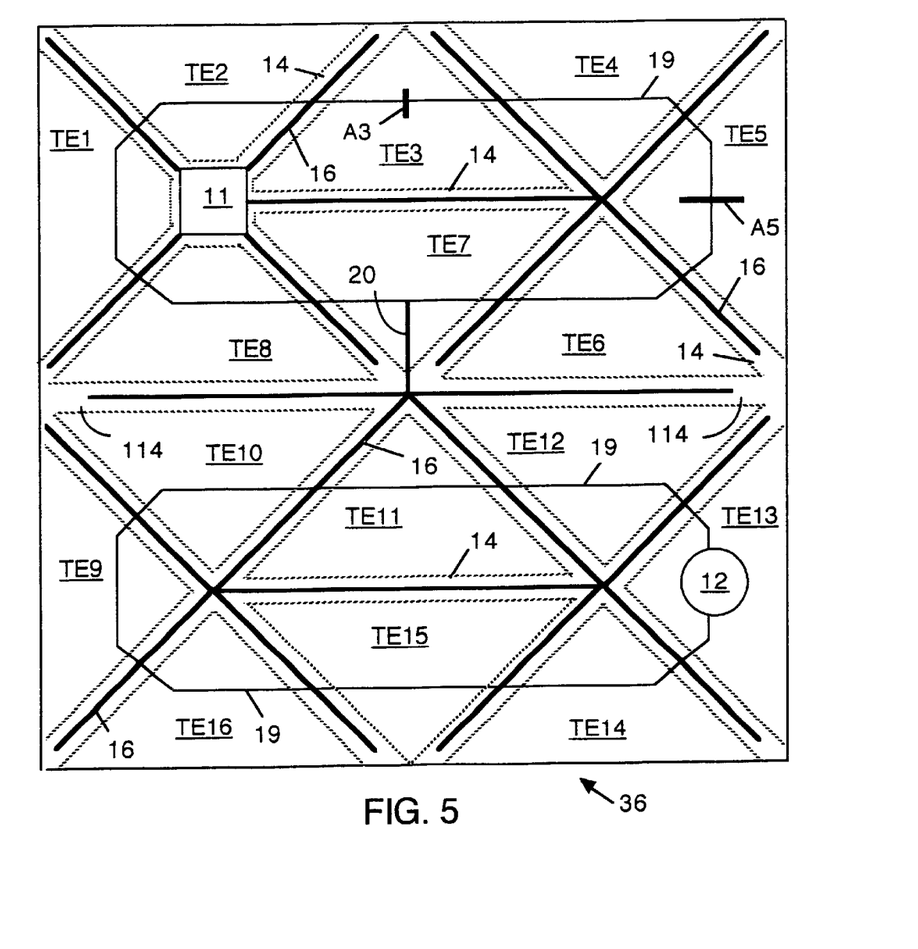
FIG. 5 illustrates a light source according to a further embodiment of the invention.

FIG. 5 illustrates a further embodiment of the invention. The arrangement differs from that of FIG. 2 in that it uses triangular light emitting elements instead of rectangular ones, and in that it includes two sets of light emitting elements connected in series. Chip 36 has 16 triangular light emitting elements, TE1–TE16. Elements TE1–TE8 are connected in parallel with each other. Also, elements TE9–TE16 are connected in parallel with each other. There is insulation, not shown, under conductors 19 at the areas where they cross over trenches 14, and there is insulation, not shown, under the whole of conductor 20. The n-layer for elements T1–T8 is isolated from the n-layer of elements TE9–TE16. The isolation can be achieved by making trenches 114, between set TE1–TE8 and set TE9–TE16, sufficiently deep so that their floors 15 are in substrate 5, instead of in n-layer 6. Trenches 114 may include conductors 16, as shown, or not.

Current applied to p-terminal 12 is fed to the p-layers of elements T9–T16 by means of conductors 19, and the current from conductors 16 of elements TE9–TE16 passes through conductor 20 to conductors 19 in contact with the p-layers of elements T1–T8. The current from conductors 16 of elements TE1–TE8 passes into n-terminal 11. Thus chip 36 comprises a first set of light generating elements (TE9–TE16 connected in parallel) connected in series with a second set of light generating elements (TE1–TE8 connected in parallel). Light extraction from the trenches can be as described before in relation to FIGS. 3, 4.

Figures 6A, 6B:
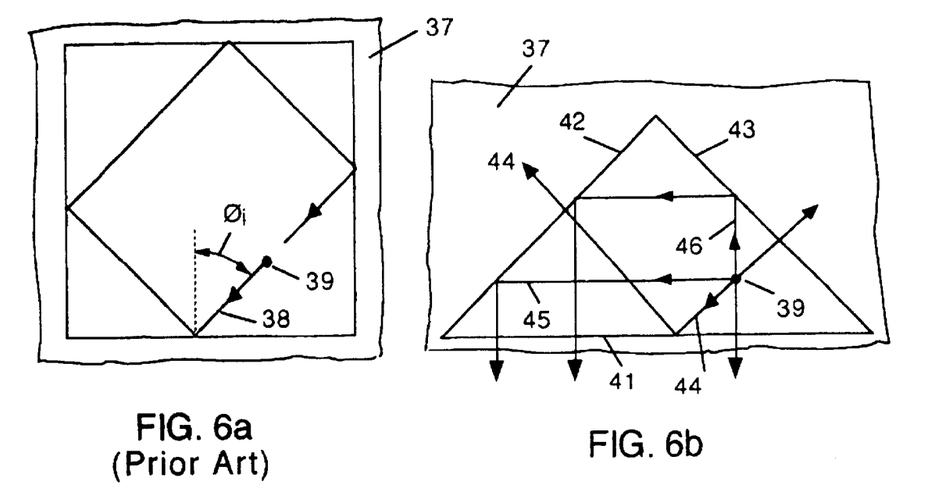
FIG. 6a illustrates light paths for an LED element having a rectangular top light-emitting surface.
FIG. 6b illustrates light paths for an LED element having a triangular top light-emitting surface.

The use of triangular elements instead of rectangular ones enhances light extraction further. This is explained as follows. FIG. 6a illustrates in plan view an LED element embedded in epoxy 37 and having a conventional (rectangular) top light-emitting surface. Epoxy 37 is taken to have a refractive index that is half that of the semiconductor of the element, resulting in the critical angle being 30 degrees. A ray 38 that starts at a point 39 and and that is parallel to top face of the element is shown hitting a side wall of the element at an incident angle $\emptyset_1=45°$. Ray 38 is subjected to successive total internal reflection and cannot escape from the element, as illustrated. By comparison with FIG. 6a, FIG. 6b shows in plani view an LED element embedded in epoxy 37 and having a triangular top, such as the ones in chip 36. The element has side walls 41, 42, 43.

Side wall 41 is inclined to sidewall 42 by an acute angle of 45 degrees. Also, side wall 43 is inclined to sidewall 41 by an acute angle of 45 degrees. A ray 44 starting at point 39 can escape even if though it hits side wall 41 at 45 degrees, because after internal reflection it hits side wall 42 with an incident angle of zero. Rays 45, 46 also hit side walls at 45 degrees and subsequently escape. Thus the element with the triangular top is more efficient for light extraction from the semiconductor than the element with a rectangular top.

In the arrangement of FIG. 5, each of the elements TE may be provided with an individually chosen adjuster A. Only two of the adjusters, A3, A5, are shown. Each adjuster A is in contact with the p-layer under it. The areas of the adjusters are chosen so that each element TE has the same illumination as the other elements TE regardless of its position on the chip. Thus, for example, adjuster A5 is larger than adjuster A3. Thus the series resistance between track 19 and the p-layer is less for element TE5 than it is for TE3. By appropriate choice of the different adjuster sizes, all elements TE can produce the same light even if the voltages applied to them are not exactly the same, and even though some of the elements have only two associated trench conductors 16 instead of three. As an alternative to adjustment by elements A, the width of track 19 can be varied from element to element to achieve the matching. Matching by differing elements A or by variation of the widths of conductors 19 can also be provided for the elements E in the arrangement of FIG. 2. Uniformity of chip lighting of better than ±3% is desirable for lensed lamps used in video displays, so as to provide uniformity of the light projected by each lamp lens.

Manufacture of a light source unit based on the chip of FIG. 2 or FIG. 5, starting with a substrate wafer common to a plurality of final light source units, includes the steps, in order, of: applying a reflective layer, for reflector 9, to the bottom surface of the base wafer; forming the semiconductor layers over the top of the wafer; forming trenches 14 (and 114 in the case of FIG. 5) into the semiconductor by chemical etching or by other means; forming tracks 16 in the trenches; insulating trenches 14 at least at the parts thereof where tracks 19 will cross over, and providing insulation for conductor 20 in the case of FIG. 5; forming tracks 19; dicing the wafer to provide separate chips; and filling the trenches and covering the top and outer sides of each chip with transparent dielectric material having a refractive index of more than 1.25.

Figure 7A:
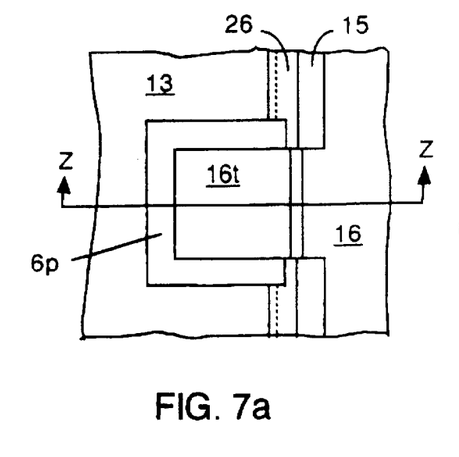
FIGS. 7a, 7b illustrate connection of a reflector track to a lower semiconductor layer.
Figure 7B:
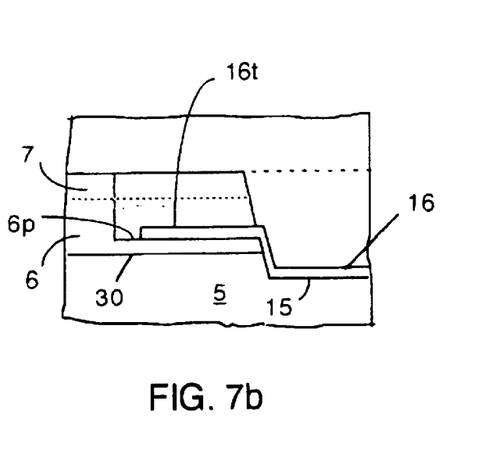

In the various arrangements discussed herein trenches 14 can extend into base 5 so that interface 30 is above the top of the portion of track 16 that is in contact with floor 15 of the trench. In this case, track 16 can have contact tabs 16t on both of its sides that are connected to the two n-layer zones separated by the trench. FIGS. 7a, 7b illustrate a contact tab which emanates from track 16 to make electrical contact with a small plateau 6p in n-layer 6. Each of the elements B or TE can have several contact tabs 16t electrically connected to the element.

In the various arrangements discussed herein reflector 16 can be extended in width so that it covers part or all of each of its side walls 26. In this case the trench is arranged to have translucent dielectric material over at least a portion of each side wall 26 to prevent short circuiting the p-layer to the n-layer. Furthermore, in the various arrangements discussed herein trench 14 may have a side-wall profile that includes one or more steps.

Figure 8:
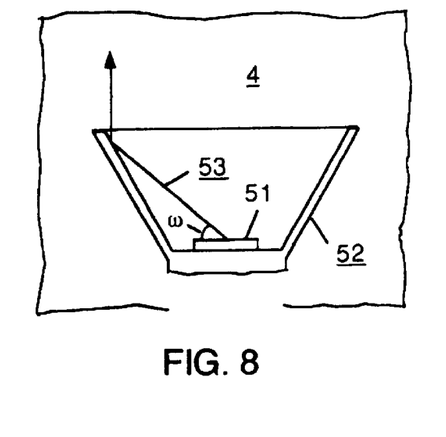
FIG. 8 illustrates a reflector cup for the chips of FIGS. 2, 5.

FIG. 8 illustrates another embodiment of the invention. Chip 51, of the type of FIG. 2 or FIG. 5, mounted in a metallic reflective cup 52 and embedded in epoxy 4. The top of epoxy 4 (not shown) is formed as a lens. Cup 52 is made deep so that a ray 53 emanating from the central area of the top face of chip 51 at an angle w relative to the chip top face is deflected by the cup. Angle w is greater than 30 degrees, and preferably greater than 40 or 45 degrees.

Figure 9:
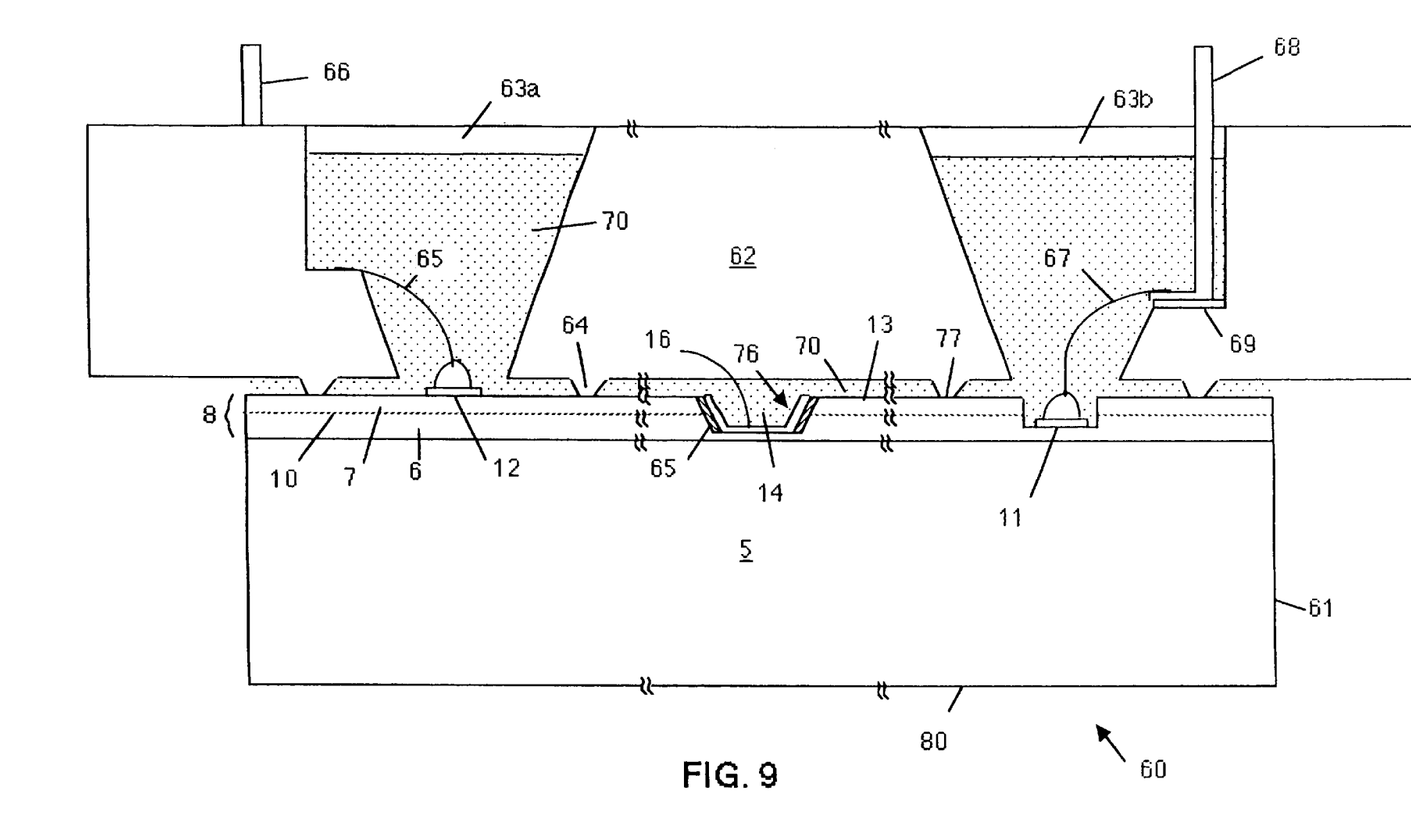
FIG. 9 illustrates an embodiment of the invention having a heat sink on the chip top face.

FIG. 9 illustrates schematically a further embodiment of the invention. Light source 60 comprises a chip 61 which is preferably of the same or similar construction as that previously discussed for FIG. 2 or FIG. 5, but with no reflector 9 on substrate 5. Chip 61 may be as large as 5 mm wide and have many elements and have an input power of 5–25 watts. For the arrangement of FIG. 9, track 16 is preferably either of small width (preferably less than 0,5 K}, or of large width, about equal to K, as shown in FIG. 9. A transparent insulator 65 covers each of the two semiconductor side walls. Track 16 covers each of insulators 65. Thus the whole of the side wall 76 includes a metallic reflector insulated from p-layer 7 and active region 10. The two side walls 76 each form an obtuse angle with top face 13. A heat sink 62 of aluminum, which has a high thermal conductivity and high optical reflectivity, is placed over chip 61. Heat sink 62 has integral spacer portions 64 drawing heat away from chip top face 13. Heat sink 62 can be 5 mm thick, or more, and is thermally connected to a larger heat sink, not shown, that cools heat sink 62. Chip p-terminal 12 is connected by bonding wire 65 to aluminum heat sink 62 and hence to the p-terminal 66 of the lamp. Chip n-terminal 11 is connected by bonding wire 67 to lamp n-terminal 68 which is supported on insulator 69. Openings 63a, 63b in heat sink 62 allow access to the chip terminals to achieve bonded wiring 65, 67. After bonding of wires 65, 67 epoxy is injected into openings 63a, 63b to protect wires 65, 67 and to cover top face 13 with epoxy. Covering top face 13 with epoxy provides perfect reflection for guided light and enhances extraction of top light from chip 61. After leaving the chip the top light is reflected by the under surface of heat sink 62 to pass back into the chip and out of substrate 5. Faces 77 of spacers 64 can be small, so that most of top face 13 is covered with epoxy, and hence most of the reflections of guided light by interface 13 are 100% total internal reflections. For the internal reflections occurring at faces 77, a proportion of the light energy is lost at each reflection. Spacers 64 can be numerous, so that they provide adequate cooling of the semiconductor junction 10. Thermal connection between spacers 64 and chip top face 13 can be enhanced by coating the lower faces of spacers 64 with a suitable heat transfer compound before pressing heat sink 62 onto chip 61. Epoxy 70 may be laid on top face 13, for example by pad printing, prior to pressing heat sink 62 onto the chip and as a separate operation from filling cavities 63*a*, 63*b*. Any translucent material having a refractive index greater than 1.25 may be used instead of epoxy for medium 70. The thickness of medium 70 under heat sink 62 is preferably greater than the wavelength of the light of the chip. The thickness can be several times the wavelength.

A 25 watt chip can have 256 light emitting elements E or TE. It is not essential to have perfect yield of the light emitting elements. If production quality is such that a few of the elements do not emit light, the lamp will still function to give powerful light.

Referring to FIG. 2, each of elements E2, E4, E5, E6. E7, E9 has an individual p-conductor 19 energising the element. It is possible by modification of the wiring to arrange that all the elements E have individual p-conductors. In this case each individual p-conductor may have a fuse, such as fuse 71 illustrated for element E6, arranged to burn out when the current to the element exceeds the intended current for the element by a factor of, for example, 2.5. By this means, short-circuited elements in the chip are automatically isolated when the power is applied to the chip. The triangulated chip of FIG. 5 also may have its wiring re-arranged to provide individual fusing of each of the elements TE.

A lamp of 256 elements can be wired as 16 blocks in series, each block having 16 elements TE connected in parallel, with each element TE having its own fuse. With this arrangement failure of an element TE, during manufacture or during service, does not put another element TE out of action. If, for example, in each bock four random elements TE are open circuit, the lamp will still function. With the yield of good elements TE at only 75% the lamp gives about 75% of the light of a lamp having no faulty elements TE.

Figure 10:
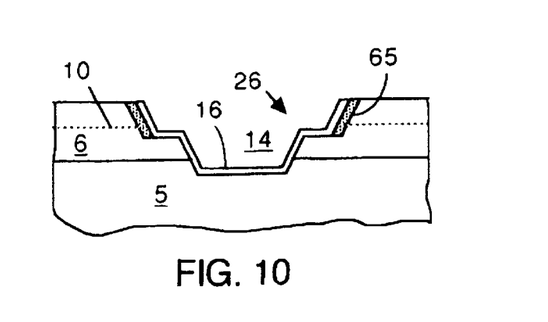
FIG. 10 illustrates an alternative form of trench.

FIG. 10 shows another arrangement for trench 14 that can be used in any of the chips described herein. As shown, trench 14 cuts into substrate 5, and includes translucent dielectric 65 over the p-layer portion of stepped side wall 26. Track 16 makes electrical contact with n-layer 6 at side wall 26.

In the various arrangements that have been discussed herein, layers 6, 7 and the active region 10 may each comprise nitride of two or more of gallium, indium and aluminium, or nitride of just one of these elements, and the substrate can be sapphire.

The various teachings herein can be applied to lamps employing a chip having a plurality of different colored active regions stacked one over the other or side by side.

Any of the light source arrangements described herein can be used in a lensed lamp having a convergent lens of a diameter greater than the diagonal of the chip.

Reflectors such as 16, 80, 62 are referred to herein as "opaque reflectors". They are reflective to light of all angles of incidence, unlike interface 30 which is transparent to light of low angles of incidence. A thin metallic film used as a reflector is regarded as an opaque reflector even if it passes some light.

What is claimed is:

1. An LED lamp for generating incoherent visible light, comprising:

a non-semiconductor member;

a semiconductor structure formed over said non-semiconductor member and comprising lower and upper inorganic semiconductor layers of opposite conductivities and an active region generating LED light, said semiconductor structure having bottom and top faces and outer side faces (25);

a non-semiconductor part passing light out of one of said bottom and top faces;

at least one metal conductor electrically connected with said upper semiconductor layer;

a plurality of cavities in said semiconductor structure each extending from said top face into said semiconductor structure and each containing a metal part that is in electrical Contact with said lower semiconductor layer and that is distant from said outer side faces; said semiconductor structure having a several light-extraction surfaces (26) arranged for harvesting light from the semiconductor structure; said light extraction surfaces being distant from said outer side faces and inclined to said semiconductor layers, LED light propagating in the semiconductor structure being diverted at said light-extraction surfaces for output from the semiconductor structure; and electrical interconnection for causing the metal parts in said cavities to pass current simultaneously when the lamp is turned on.

2. An LED lamp according to claim 1, wherein said nonsemiconductor member is transparent to light generated in the semiconductor structure.

3. An LED lamp according to claim 1, wherein said light extraction surfaces are oblique to said layers.

4. An LED lamp according to claim 1 including a metal layer at said top face covering most of the top face.

5. An LED lamp according to claim 1 including at least one reflector under said top face the plane of which is parallel to said layers reflecting LED light that has been diverted by a said light-extraction surface.

6. An LED lamp according to claim 1, wherein said light extraction surfaces are side walls of cavities in the semiconductor structure.

7. An LED lamp according to claim 1, wherein said light extraction surfaces are side walls of said cavities.

8. An LED lamp according to claim 1, wherein said light extraction surfaces are side walls of cavities that cut into said semiconductor structure by more than 50% of the thickness of the semiconductor structure.

9. An LED lamp according to claim 1, wherein said light extraction surfaces are side walls of cavities that extend into said lower semiconductor layer.

10. An LED lamp according to claim 1 including light extraction trenches defining boundaries between LED elements.

11. An LED lamp according to claim 1 including light extraction trenches formed in said semiconductor structure that contains metal pieces.

12. An LED lamp according to claim 11, wherein at least each of said metal pieces is in electrical contact with one of said semiconductor layers and diverts LED light.

13. An LED lamp according to claim 1 including LED portions of said semiconductor structure each provided with an associated metal conductor for energizing the portion and an associated electrical link (71) in series with the associated conductor, some of said LED portions being faulty and having their associated links intentionally disrupted.

14. An LED lamp according to claim 13, wherein said links are fuses.

15. An LED lamp according to claim 1, wherein said light extraction surfaces are walls of cavities that are filled with translucent dielectric material.

16. An LED lamp according to claim 1 including light-extraction trenches that are oblique one to another.

17. An LED lamp according to claim 16 including LED elements with triangular top faces.

18. An LED lamp according to claim 1 comprising light-extraction cavities having side walls and containing metal reflectors that provide multiple reflection of light passing through the side walls.

19. An LED lamp according to claim 1 including a heat sink that is less than 50 microns away from said active region.

20. An LED lamp for generating incoherent visible light, comprising
a non-semiconductor member;
a semiconductor structure formed over said non-semiconductor member, and comprising lower and upper inorganic semiconductor layers of opposite conductivities and an active region generating LED light, said semiconductor structure having bottom and top faces and outer side faces;
LED portions within said semiconductor structure each provided with an associated metal track for energizing the portion and an associated electrical link (71) in series with the associated track, some of said LED portions being faulty and having their associated links intentionally disrupted;
electrical connections for energizing several of said LED portions simultaneously; and
wherein said semiconductor is formed with light-extraction surfaces that are inclined to said layers and that are distant from said outer faces diverting light propagated in the semiconductor surface.

21. An LED lamp according to claim 20, wherein said disrupted links are disrupted fuses.

22. An LED lamp for generating incoherent visible light, comprising:
a non-semiconductor part translucent to light generated in the lamp;
a semiconductor structure formed over said non-semiconductor part and comprising lower and upper inorganic semiconductor layers of opposite conductivities and an active region generating LED light;
a plurality of metal conductors in electrical contact with said lower semiconductor layer;
a transparent layer of non-semiconductor material above said semiconductor structure;
a heat sink above said transparent non-semiconductor layer;
a plurality of cavities in said semiconductor structure for extracting light from the structure, said cavities extending from an outer surface of said structure into at least one of said semiconductor layers; and
electrical connections for energizing said metal conductors simultaneously.

23. An LED lamp according to claim 22, wherein said semiconductor structure has top surface areas devoid of chip terminals and wherein most of the heat generated in the semiconductor structure passes to said heat sink via said top surface areas.

24. An LED lamp according to claim 22, wherein said semiconductor structure has short-circuits between said lower and upper semiconductor layers and has metal links that are intentionally disrupted so as to enable the lamp to function.

25. An LED lamp according to claim 22, wherein said cavities cut through said semiconductor structure.

26. A lamp for generating incoherent visible light, comprising:
a non-semiconductor member;
a semiconductor structure laid over said non-semiconductor member and comprising lower and upper inorganic semiconductor layers of opposite conductivities and an active region generating LED light;
metal conductors in electrical contact with said lower semiconductor layer;
light emitting portions of said semiconductor structure each having two neighboring light-extraction trenches one of which is at an acute angle to the other; the trenches diverting light propagating in the semiconductor structure; and
electrical connection for energizing metal conductors simultaneously.

27. An LED lamp according to claim 26, wherein said trenches contain metallic conductors that make electrical contact with said lower semiconductor layer.

28. An LED lamp according to claim 26 wherein said portions have triangular top faces.

29. An LED lamp according to claim 26 including a heat sink (62) that is less than 50 microns away from said active region.

30. An LED lamp according to clam 26, wherein said semiconductor structure is formed on said non-semiconductor member.

31. An LED lamp according to clam 26, wherein said trenches have side walls that are oblique to said semiconductor layers.

32. An LED lamp for generating incoherent visible light, comprising:
a non-semiconductor member having a top face;
a semiconductor structure formed over said top face, said semiconductor structure comprising lower and upper inorganic semiconductor layers of opposite conductivities and an active region generating LED light;
at least one metal conductor in electrical contact with said lower semiconductor layer;
a top conductor layer formed on and electrically connected to said upper semiconductor layer; and
wherein said semiconductor structure has outer side faces and has a plurality of light-extraction cavities for harvesting light from the semiconductor structure, said light-extraction cavities extending from the top surface of said upper semiconductor layer and cutting into at least one of said semiconductor layers, and being distant from said outer side faces, LED light propagating in the semiconductor structure being diverted at said light-extraction cavities.

33. An LED lamp according to clam 32, wherein said top conductor layer is metal.

34. An LED lamp according to clam 32, wherein said top conductor layer is gold so thin as to be translucent.

35. An LED lamp according to clam 32, wherein said cavities are trenches.

36. An LED lamp according to clam 32, wherein said cavities cut into said lower semiconductor layer.

37. An LED lamp according to clam 32, wherein at least one of said cavities cuts through the semiconductor structure.

38. An LED lamp for generating incoherent visible light, comprising:

a non-semiconductor member having a top face;

a semiconductor structure formed over said top face, said semiconductor structure comprising lower and upper inorganic semiconductor layers of opposite conductivities and an active region generating LED light;

at least one metal conductor over and in electrical contact with part of said lower semiconductor layer;

a top conductor layer formed on and electrically connected to said upper semiconductor layer; and wherein said semiconductor structure has outer side faces and has several light-extraction surfaces arranged for harvesting light from the semiconductor structure, said light-extraction surfaces being distant from said outer side faces and inclined to said semiconductor layers, LED light propagating in the semiconductor structure being diverted at said light-extraction faces.

39. An LED lamp according to claim 37, wherein said top conductor layer is of metal.

40. An LED lamp according to claim 37, wherein said light-extraction surfaces are oblique to said semiconductor layers.

41. An LED lamp according to claim 37 having several cavities containing metal parts.

42. An LED lamp for generating incoherent visible light, comprising:

a non-semiconductor member having a top face;

a semiconductor structure formed over said top face, said semiconductor structure comprising lower and upper inorganic semiconductor layers of opposite conductivities and an active region generating LED light;

at least one metal conductor in electrical contact with said lower semiconductor layer; and wherein said semiconductor structure has outer side faces and has light-extraction surfaces arranged for harvesting light from the semiconductor structure, said light-extraction surfaces being distant from said outer side faces and inclined to said semiconductor layers, LED light propagating in the semiconductor structure being diverted at said light-extraction surfaces, and wherein said semiconductor structure has first and second LEDs with the cathode of one electrically connected to the anode of the other with a metal conductor (20).

* * * * *